United States Patent [19]
Suzuki et al.

[11] Patent Number: 6,078,012
[45] Date of Patent: *Jun. 20, 2000

[54] AIRBAG CIRCUIT WITH RESISTOR

[75] Inventors: Masataka Suzuki; Hiroyuki Ashiya; Yoshiyuki Tanaka, all of Shizuoka, Japan

[73] Assignee: Yazaki Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/663,876

[22] Filed: Jun. 19, 1996

[30] Foreign Application Priority Data

Jun. 22, 1995 [JP] Japan ................................ 7-156477

[51] Int. Cl.$^7$ ................................................. H05K 1/16
[52] U.S. Cl. ................... 174/260; 280/735; 364/424.055; 29/832
[58] Field of Search .................... 307/10.1; 180/282; 280/735; 340/436, 438; 364/424.055; 333/1, 81 A, 246, 24 R; 361/782, 811, 827, 760, 761, 766, 767; 174/260; 439/620; 338/220; 29/832, 840

[56] References Cited

U.S. PATENT DOCUMENTS

| 4,184,043 | 1/1980 | Hildering | 174/260 |
| 5,045,641 | 9/1991 | Urushibata et al. | 174/74 R |
| 5,083,237 | 1/1992 | Tsuji | 361/765 |
| 5,270,673 | 12/1993 | Fries et al. | 333/246 |
| 5,309,135 | 5/1994 | Langford | 338/211 |
| 5,468,919 | 11/1995 | Shiozaki et al. | 174/261 |
| 5,469,333 | 11/1995 | Ellerson et al. | 361/779 |
| 5,699,611 | 12/1997 | Kurogi et al. | 29/840 |

FOREIGN PATENT DOCUMENTS

| 4-24611 | 6/1992 | Japan . |
| 5-62754 | 3/1993 | Japan . |
| 6-176820 | 6/1994 | Japan . |

Primary Examiner—Kristine Kincaid
Assistant Examiner—Kamand Cuneo
Attorney, Agent, or Firm—Armstrong, Westerman, Hattori, McCleland, & Naughton

[57] ABSTRACT

In order to standardize the conductors of a flat cable by changing an electrical resistance value of resistors provided in a bonding area where the flat cable is connected to lead wires and setting a specific value for the electrical resistance value of the entire signal transmission apparatus such as an air bag, the air bag circuit is provided with a flat cable, having a specific electrical resistance value and lead wires. The electrical resistance value of the entire circuit is set at a specific value by selecting the electrical resistance value of the resistors provided the a bonding area between the flat cable and the lead wires.

5 Claims, 3 Drawing Sheets

AIRBAG CIRCUIT WITH RESISTOR

BACKGROUND OF THE INVENTION

1. Field of the Invention

The present invention relates to a signal transmission apparatus provided with a flat cable and lead wires with which standardized conductors for the flat cable can be used universally.

2. Description of the Related Prior Art

In a steering signal transmission apparatus a vehicle, signals from a flat cable (hereafter also referred to as an FFC) wound around a rotating body is transmitted to the outside via electrical wire.

The steering signal transmission apparatus shown in FIGS. 5, 6A–6C is disclosed in Japanese Utility Model Application Laid Open Publication No. 1992/24611. Reference number 51 indicates a first housing which constitutes a stator and reference number 52 indicates a second housing which constitutes a rotor. The two housings are fitted together concentrically one into the other so that they can rotate relative to each other, and a flat cable 54 is coiled inside a ring-like chamber 53 formed between the two housings. One end of the flat cable 54 is secured to the first housing and the other end is secured on the side of the second housing 52.

Conductors 54a at one end of the flat cable 54, are each connected to one end of a joint bar 55 by welding. A plurality of joint bars 55 are linked together in advance with an insulating supporting body 56 in correspondence to the pitch of the conductors 54a of the flat cable 54 and, at the other end of each joint bar 55, a corresponding lead wire 57 is connected by welding. The connecting portions of the individual conductors connected to these joint bars 55 are protected as a unit by a resin molded protective body 58, which, at the two sides, partially includes insulating coverings 54b of the flat cable 54 and 57b of the various lead wires 57.

However, when an air bag is mounted in the vehicle at present, there are specifications that must be conformed to in regard to the electrical resistance value of an air bag circuit of the steering signal transmission apparatus described above, stipulating upper and lower limits, which are imposed by various manufacturers depending upon vehicle models. Because of this, the width w and the thickness t of the flat cable in FIG. 4 are adjusted to set the electrical resistance of the air bag circuit at a specific value. In other words, new conductors must be produced for every manufacturer or vehicle model in which the air bag is to be mounted, necessitating that several types of flat cables be prepared. There is another problem in that the durability and the like of the FFC used in the air bag circuit must be verified for each case.

SUMMARY OF THE INVENTION

Accordingly, an object of the present invention, which reflects the problems of the signal transmission apparatuses in the prior art described above, is to standardize the conductors of the flat cable by providing for changes in the electrical resistance at the bonding area where the flat cable and the lead wires are connected, thereby making it possible to set the electrical resistance of the signal transmission apparatus at a specific value.

In the signal transmission apparatus according the present invention, which is provided with a flat cable having a specific electrical resistance value and lead wires, the electrical resistance of the signal transmission apparatus is set at a specific value by changing the electrical resistance value of resistors provided in the bonding area where the flat cable and the lead wires are connected.

Also, the signal transmission apparatus according to the present invention may be employed in a steering signal transmission apparatus for a vehicle.

In the signal transmission apparatus according to the present invention, by setting the electrical resistance of the flat cable used in the signal transmission apparatus at a specific value and changing the electrical resistance value of the resistance provided in the bonding area where the flat cable and the lead wires are connected, the electrical resistance of the signal transmission apparatus can be set at a specific value.

Also, according to the present invention, even when the electrical resistance value of the air bag circuit in a steering signal transmission apparatus changes in correspondence to the manufacturer or the model, the electrical resistance of the air bag circuit can be set at a specific value by setting the electrical resistance of the flat cable at a specific value and changing the electrical resistance value of the resistance provided in the bonding area where the flat cable and the lead wires are connected.

BRIEF DESCRIPTION OF THE DRAWINGS

The above and other features of the invention and the concomitant advantages will be better understood and appreciated by persons skilled in the field to which the invention pertains in view of the description given in conjunction with the accompanying drawings which illustrate preferred embodiments. In the drawings.

DETAILED DESCRIPTION OF THE PREFERRED EMBODIMENTS

Figure 1:
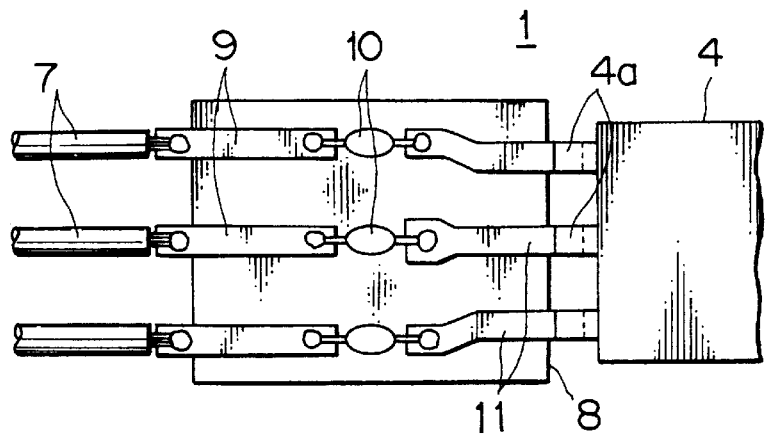
FIG. 1 is a plan view of a first embodiment of the signal transmission apparatus according to the present invention.

The signal transmission apparatus according to the present invention is explained in reference to the drawings. FIG. 1 is a plan view of the first embodiment of the signal transmission apparatus according to the present invention. This embodiment may be employed, for instance, as a steering signal transmission apparatus and an FFC 4 and lead wires 7 are connected via conductors 9 constituted of, for example, copper plate on a substrate 8, which is constituted of synthetic resin or the like, at a linking portion 1 of the signal transmission apparatus.

The FFC 4 is provided with three conductors 4a and since the cross sectional shape of the conductors 4a is standardized, the electrical resistance of the entire FFC 4 has a specific value and, therefore, the FFC 4 can be used universally, regardless of the manufacturer, the model and the like of the vehicle in which the air bag is mounted. These conductors 4a are bonded by welding to conductors 11, which are constituted of copper plate or the like on the substrate 8. Three lead wires 7 bonded by welding to conductors 9 which are constituted with copper plate or the like on the substrate 8 in a manner similar to that in which the three conductors 4a are linked to the conductors 11.

Resistors 10 are provided between the conductors 9 and the conductors 11, bonded thereto by welding. The electrical resistance value of the resistors 10 may be adjusted to set a specific value for the electrical resistance of the air bag circuit. In other words, while there are, at present, different specifications in correspondence to the manufacturer, the vehicle model and the like, which stipulate upper and lower limits for the resistance value of the air bag circuit of a steering signal transmission apparatus, since a specific value is set for the electrical resistance of the overall FFC 4 as described above, the electrical resistance value of the air bag circuit may be adjusted with the resistance value of the resistors 10.

As a result, even if the electrical resistance value of the air bag circuit in a steering signal transmission apparatus changes in correspondence to the manufacturer, the vehicle model and the like, a specific value can be set for the electrical resistance of the air bag circuit by setting a specific value for the electrical resistance of the flat cable and changing the electrical resistance value of the resistors provided in the bonding area where the flat cable and the lead wires are connected.

Figure 2:
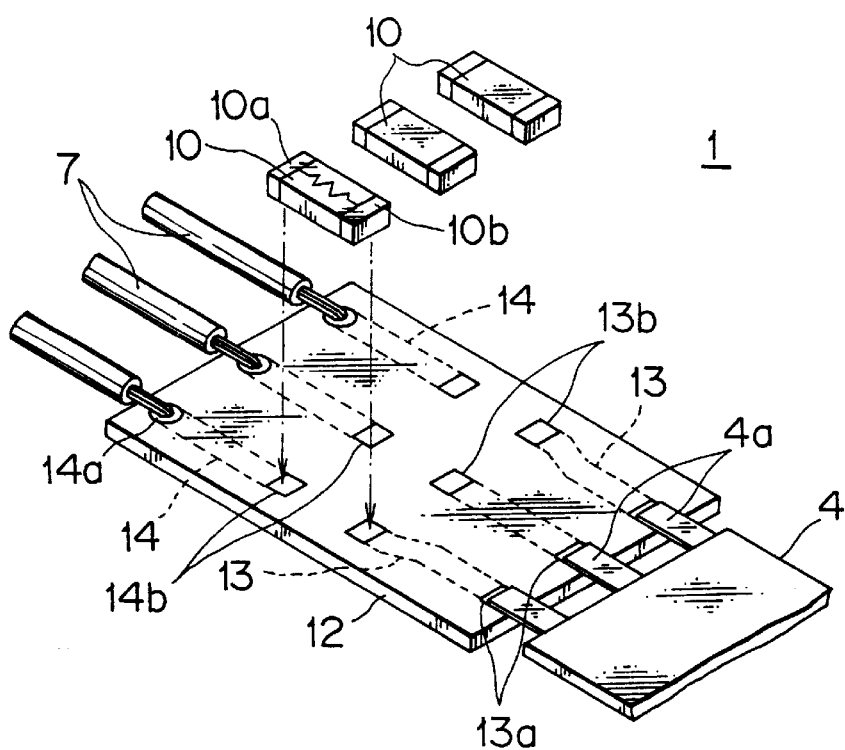
FIG. 2 is a perspective of a second embodiment of the signal transmission apparatus according to the present invention.
Figure 4:
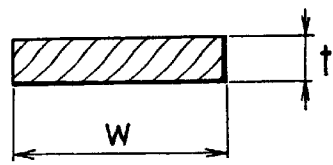
FIG. 4 is a cross section of a conductor for a flat cable.

Next, the second embodiment of the signal transmission apparatus according to the present invention is explained in reference to the perspective shown in FIG. 2. The explanation for this embodiment, too, is given in reference to a signal transmission apparatus employed as a steering signal transmission apparatus. In this embodiment, the FFC 4 and the lead wires 7 are linked to each other on a printed circuit board (hereafter referred to as a "PCB") 12 via conductor pattern portions 13 and 14 of the PCB 12, at the linking portion 1 of the signal transmission apparatus.

The FFC 4 is provided with three conductors 4a and, since the cross sectional shape of the conductors 4a is standardized, the electrical resistance of the overall FFC 4 has a specific value. Thus, it can be used universally, regardless of the manufacturer, the vehicle model and the like of the vehicle in which the air bag is mounted. The conductors 4a are each bonded by welding to one end 13a of the conductor pattern portion 13 on the PCB 12. Three lead wires 7 are each bonded by welding to the conductor pattern portion 14 on the PCB 12 at a land portion 14a, in a manner similar to that in which the conductors 4a are bonded to the ends 13a by welding.

Resistors 10 are provided between the conductor pattern portions 13 and 14 of the PCB 12. In this embodiment, the resistors 10 are formed as chips and at the two ends of each chip-like resistor 10, conductor portions 10a and 10b are formed. The chip-like resistors 10 are each bonded by welding to the end portions 13b and 14b of the conductor pattern portions 13 and 14 respectively of the PCB 12 so that they are electrically connected to the conductor patterns 13 and 14 of the PCB 12.

The electrical resistance value of the resistors 10 is adjusted to set a specific value for the electrical resistance of the air bag circuit. In other words, as explained earlier, there are various specifications imposed on the resistance value of the air bag circuit of a steering signal transmission apparatus, at present, depending upon the manufacturer, the vehicle model and the like, stipulating its upper and lower limits, and since the electrical resistance value of the entire FFC 4 is set at a specific standard value, the electrical resistance value of the air bag circuit may be adjusted with the resistance value of the resistors 10.

Consequently, in this embodiment, too, even if the electrical resistance value of the air bag circuit in a steering signal transmission apparatus changes in correspondence to the manufacturer, the vehicle model and the like, it is possible to set a specific value for the electrical resistance of the air bag circuit by setting a specific value for the electrical resistance of the flat cable and changing the electrical resistance value of the resistors provided in the bonding area where the flat cable and the lead wires are connected.

Figure 3:
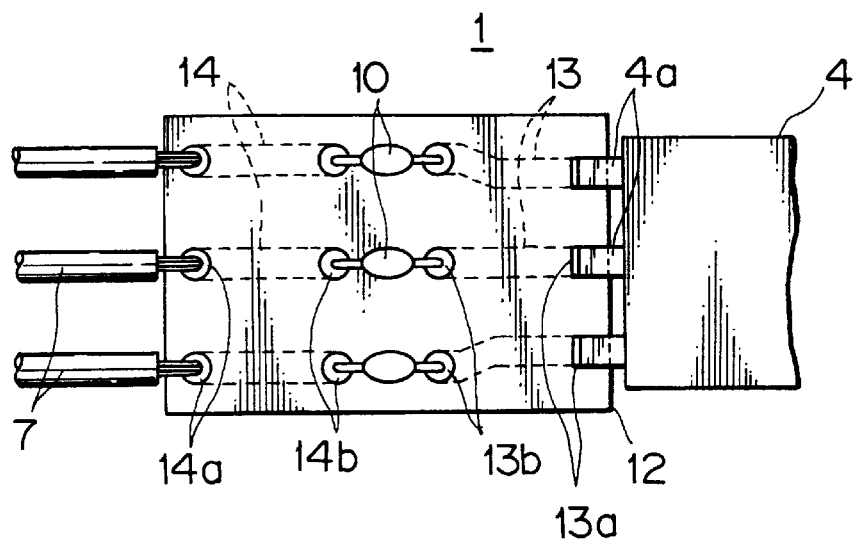
FIG. 3 is a plan view of a third embodiment of the signal transmission apparatus according to the present invention.
Figure 5:
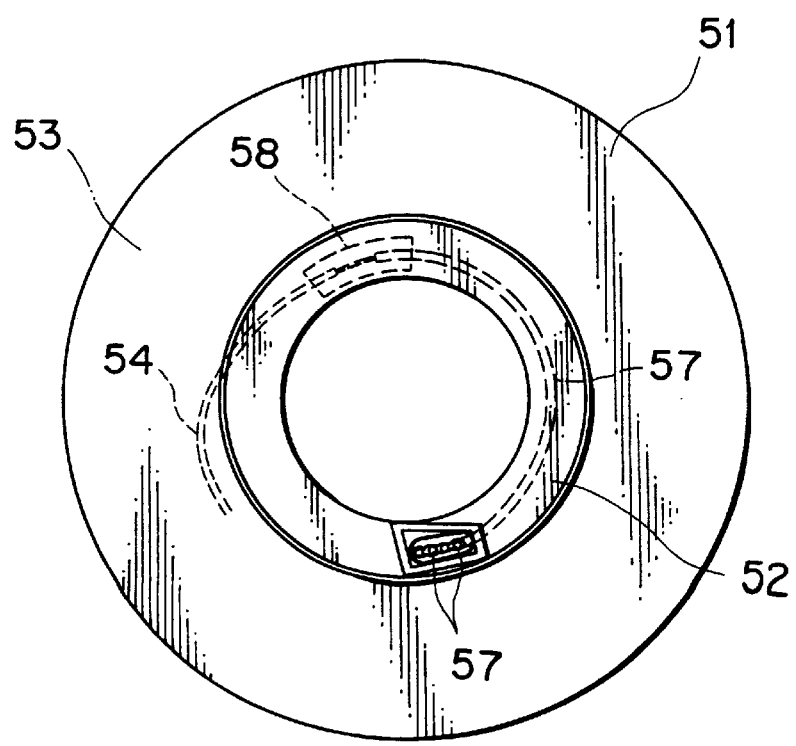
FIG. 5 is a plan view of a steering signal transmission apparatus a vehicle in the prior art.
Figure 6A:
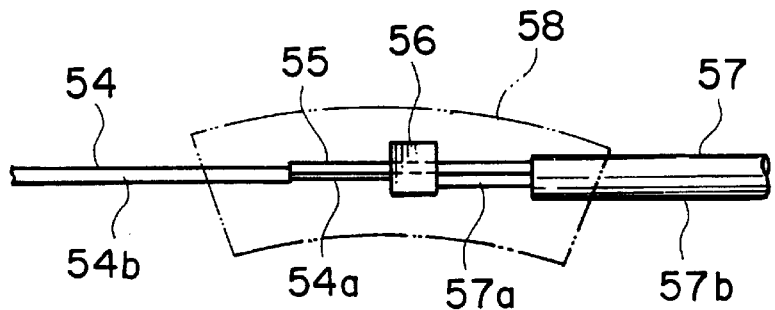
FIG. 6A is a side view of the connecting portion of the flat cable and the lead wires in the apparatus shown in FIG. 5.
Figure 6B:
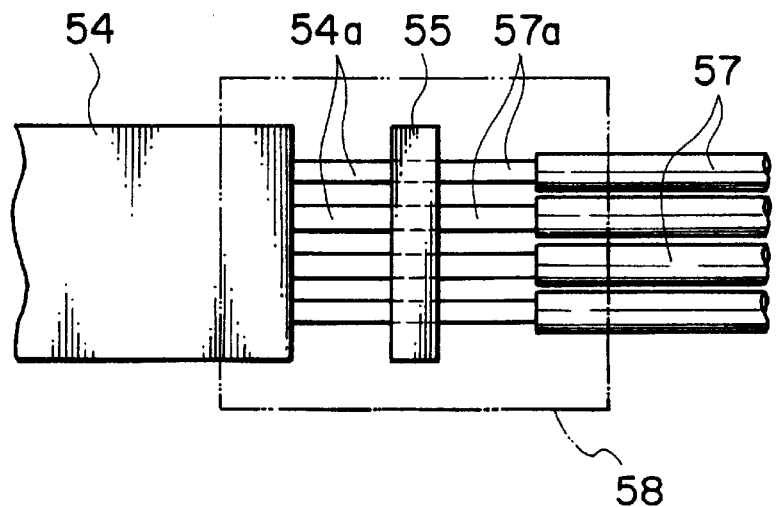
FIG. 6B is a bottom view of the apparatus of FIG. 5.
Figure 6C:
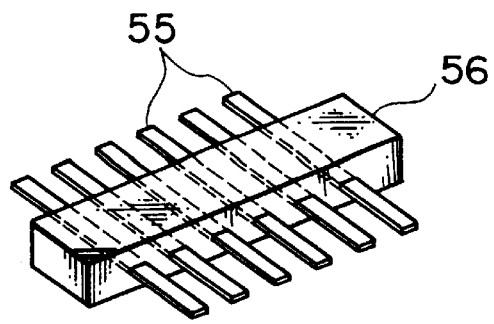
FIG. 6C is a perspective showing the relationship between the joint bars and the insulating supporting body of the prior art.

Next, the third embodiment of the signal transmission apparatus according to the present invention is explained in reference to FIG. 3. In this embodiment, too, the signal transmission apparatus may be employed as, for instance, a steering signal transmission apparatus, and the FFC 4 and the lead wires 7 are linked to each other on the PCB 12 via the conductor pattern portions 13 and 14, at the linking portion 1 of the signal transmission apparatus.

The FFC 4 is provided with three conductors 4a, and since the cross sectional shape of these conductors 4a is standardized, the electrical resistance of the entire FFC 4 has a specific value, which makes it possible to use the FFC 4 universally, regardless of the manufacturer, the model and the like of the vehicle in which the air bag is mounted. These conductors 4a are each bonded by welding to one end 13a of the conductor pattern portion 13 on the PCB 12. Three lead wires 7 are bonded by welding to the conductor pattern portion 14 on the PCB 12 at its landing portions 14a in a manner similar to that in which the conductors 4a are bonded to the ends 13a by welding.

In this embodiment, resistors that are similar to the resistors 10 in the first embodiment are employed. The resistors 10 in this embodiment are each bonded by welding to the land portions 13b and 14b between the conductor pattern portion 13 and the conductor pattern portion 14.

The electrical resistance value of the resistors 10 is adjusted to ensure that a specific value is set for the electric resistance value of the air bag circuit. In other words, even if the electrical resistance of the air bag circuit of a steering signal transmission apparatus changes in correspondence to the manufacturer, the model and the like of the vehicle, it is possible to set the electrical resistance of the air bag circuit at a specific value by setting a specific standard value for the electrical resistance of the entire FFC 4, as described earlier, and adjusting the electrical resistance value of the resistors 10.

According to the present invention, since a specific value can be set for the electrical resistance in a signal transmission apparatus by setting a specific value for the electrical resistance of the flat cable used in the signal transmission apparatus and changing the electrical resistance value of the resistors provided in the bonding area where the flat cable and the lead wires are connected, it is possible to provide a signal transmission apparatus in which the conductors of the flat cable can be standardized.

Also, according to the present invention, since a specific value can be set for the electrical resistance of an air bag circuit by changing the electrical resistance value of the resistors provided in the bonding area where the flat cable and the lead wires are connected, the conductors of the flat cable can be made universal for the various manufacturers and vehicle models.

What is claimed is:

1. A method for setting an overall electrical resistance value of a signal transmission apparatus of a motor vehicle to the value required by the manufacturer of the motor vehicle, the signal transmission apparatus having an air bag circuit with a flat cable of a fixed electrical resistance value and a lead wire, comprising the steps of:

connecting a first conductor to the flat cable;

connecting a second conductor to the lead wire; and connecting between said first and second conductors a resistor having a resistance value which sets said overall electrical resistance value of the signal transmission apparatus at the value required by the manufacturer.

2. A method for setting an overall electrical resistance value of signal transmission apparatus of a motor vehicle to the value required by the manufacturer of the motor vehicle, the signal transmission apparatus having an air bag circuit with a flat cable of a fixed electrical resistance value and a lead wire, comprising the steps of:

connecting a first conductor to the flat cable;

connecting a second conductor to the lead wire; and connecting between said first and second conductors a chip having a resistance value which sets said overall electrical resistance value of the signal transmission apparatus at the value required by the manufacturer.

3. A signal transmission configuration comprising:

a first air bag circuit having a first overall electrical resistance value, said first air bag circuit including:

a first lead wire;

a first flat cable having a fixed electrical resistance value; and a first substrate having first and second conductors, each conductor having a land portion and an end portion, the end portion of said first conductor of said first substrate being bonded to said first flat cable, and the end portion said second conductor of said first substrate being bonded to said first lead wire;

a second air bag circuit having a second overall electrical resistance value different from said first overall electrical resistance value of said first air bag circuit, said second air bag circuit comprising:

a second lead wire;

a second flat cable having said fixed electrical resistance value; and a second substrate having first and second conductors, each conductor having a land portion and an end portion, the end portion of said first conductor of said second substrate being bonded to said second flat cable, and the end portion said second conductor of said second substrate being bonded to said second lead wire; and first and second resistors, said first resistor having a resistance value different from the resistance value of said second resistor, said first resistor being connected between the land portions of said conductors of said first substrate to set said first overall electrical resistance value of said first air bag circuit, and said second resistor being connected between the land portions of said conductors of said second substrate to set said second overall electrical resistance value of said second air bag circuit.

4. A signal transmission configuration according to claim 3, wherein said substrates are made of synthetic resin and said conductors are printed circuits formed on said substrates.

5. A signal transmission configuration according to claim 3, wherein said resistors are chips having conductor portions at their ends.

* * * * *